(12) United States Patent
Park (10) Patent No.: US 11,925,085 B2
(45) Date of Patent: Mar. 5, 2024

(54) DISPLAY DEVICE AND ELECTRONIC DEVICE HAVING THE SAME (71) Applicant: SAMSUNG DISPLAY CO., LTD., Yongin-si (KR)

(72) Inventor: Moon-Chul Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/165,182

(22) Filed: Feb. 6, 2023

(65) Prior Publication Data
US 2023/0189594 A1 Jun. 15, 2023

Related U.S. Application Data (62) Division of application No. 16/860,945, filed on Apr. 28, 2020, now Pat. No. 11,574,981.

(30) Foreign Application Priority Data

May 20, 2019 (KR) .................. 10-2019-0059021

(51) Int. Cl.
H10K 59/13 (2023.01)
G09G 3/3208 (2016.01)
(Continued)

(52) U.S. Cl.
CPC ......... H10K 59/131 (2023.02); G09G 3/3208 (2013.01); H01L 23/60 (2013.01); H01L 27/0248 (2013.01); H05K 1/0259 (2013.01)

(58) Field of Classification Search
CPC ............ H10K 59/131; H10K 59/1315; H10K 59/126; H10K 50/80; G09G 3/3208;
(Continued)

(56) References Cited

U.S. PATENT DOCUMENTS 9,000,428 B2    4/2015  Lee et al.
2005/0135027 A1* 6/2005  Suh ..................... H01L 27/0255
                                                    361/56
(Continued)

FOREIGN PATENT DOCUMENTS

KR    10-2014-0133053 A    11/2014

Primary Examiner — S M Sohel Imtiaz
(74) Attorney, Agent, or Firm — Lewis Roca Rothgerber Christie LLP (57) ABSTRACT A display device includes a display panel including a plurality of pixels, a first panel pad, and a second panel pad and a circuit board including a first substrate pad and a second substrate pad to apply a first power voltage to the first panel pad and the second panel. The display panel further includes a first power line pattern connected to the second substrate pad to apply the first power voltage to the pixels and a second power line pattern connected to the first substrate pad. The circuit board includes a first electrostatic discharge protection circuit connected between the first substrate pad and the second substrate pad, a substrate power pattern electrically connected to the first substrate pad, a ground pattern receiving a ground voltage, and a second electrostatic discharge protection circuit connected between the substrate power pattern and the ground pattern.

13 Claims, 8 Drawing Sheets (51) Int. Cl.
 *H01L 23/60* (2006.01)
 *H01L 27/02* (2006.01)
 *H05K 1/02* (2006.01)
 *H10K 59/131* (2023.01)

(58) Field of Classification Search
 CPC ............. G09G 3/3225; G09G 2330/04; G09G 2330/06; H01L 23/60; H01L 27/0248; H01L 27/0296; H05K 1/0259; H05K 3/323; H05K 1/189; H05K 2201/10128
 See application file for complete search history.

(56) References Cited

U.S. PATENT DOCUMENTS

| | | | | |
|---|---|---|---|---|
| 2006/0118787 A1* | 6/2006 | Lee | ........................ | H01L 27/124 257/E27.111 |
| 2007/0201175 A1* | 8/2007 | Arai | .................... | H01L 27/0255 361/56 |
| 2008/0198517 A1* | 8/2008 | Son | ........................ | H02H 9/046 361/56 |
| 2009/0309477 A1* | 12/2009 | Bang | ..................... | H10K 59/131 445/24 |
| 2010/0201900 A1* | 8/2010 | Lee | ..................... | G02F 1/13452 349/40 |
| 2010/0225626 A1* | 9/2010 | Lin | ..................... | H01L 27/0251 345/205 |
| 2013/0141912 A1* | 6/2013 | Kim | ........................ | F21V 23/001 362/249.02 |
| 2014/0285982 A1* | 9/2014 | Kim | ........................ | H05K 1/028 361/749 |
| 2014/0332769 A1* | 11/2014 | Lee | ..................... | H10K 59/126 257/40 |
| 2015/0061146 A1* | 3/2015 | Kato | ........................ | H01L 23/60 257/773 |
| 2015/0062511 A1* | 3/2015 | Shin | .................. | G02F 1/136286 438/30 |
| 2015/0355749 A1* | 12/2015 | Min | ..................... | G06F 3/0416 345/174 |
| 2016/0027372 A1* | 1/2016 | Yan | ........................ | G09G 3/20 345/211 |
| 2019/0014670 A1* | 1/2019 | Lee | ..................... | H05K 5/0217 |

* cited by examiner

DISPLAY DEVICE AND ELECTRONIC DEVICE HAVING THE SAME

CROSS-REFERENCE TO RELATED APPLICATIONS

This application is a divisional of U.S. patent application Ser. No. 16/860,945, filed Apr. 28, 2020, which claims priority to and the benefit of Korean Patent Application No. 10-2019-0059021, filed May 20, 2019, the entire content of both of which is incorporated herein by reference.

BACKGROUND

1. Field

The present disclosure relates to a display device. More particularly, the present disclosure relates to a display device having an electrostatic discharge protection function and an electronic device having the display device.

2. Description of the Related Art

Various electronic devices, such as smartphones, tablet computers, notebook computers, and smart television sets, are being developed in the recent years. The electronic devices include a display device to provide information. The electronic devices further include a variety of electronic modules in addition to the display device.

An electronic device is manufactured by assembling the display device and the electronic modules. In some cases, the electronic modules are arranged using an external case of electronic device and a bracket.

An organic light emitting display device displays an image using organic light emitting diodes that generate light from electron-hole recombination. The organic light emitting display device may have a fast response speed and a low power consumption compared to the related art display devices.

In general, the organic light emitting display device includes a plurality of pixels each including a driving transistor and an organic light emitting diode, and each pixel controls an amount of current flowing to the corresponding organic light emitting diode, thereby displaying a gray level (e.g., grayscale value) corresponding thereto.

A display panel of the organic light emitting display device is operated by receiving a power source voltage and a driving signal, from an external source, such as a printed circuit board.

When static electricity is introduced into the signal lines or the pads through which the power source voltage and the driving signal are transmitted, circuit elements in the organic light emitting display device may face the risk of being damaged.

SUMMARY

The present disclosure provides a display device having electrostatic discharge protection function.

The present disclosure provides an electronic device including the display device.

Some embodiments of the present disclosure provide a display device including a display panel including a plurality of pixels, a first panel pad, and a second panel pad and a circuit board including a first substrate pad and a second substrate pad, which are respectively connected to the first panel pad and the second panel pad to apply a first power voltage to the first panel pad and the second panel pad. The display panel further includes a first power line pattern connected to the second substrate pad to apply the first power voltage to the plurality of pixels and a second power line pattern connected to the first substrate pad. The circuit board further includes a first electrostatic discharge protection circuit connected between the first substrate pad and the second substrate pad, a substrate power pattern electrically connected to the first substrate pad, a ground pattern receiving a ground voltage, and a second electrostatic discharge protection circuit connected between the substrate power pattern and the ground pattern.

In some embodiments, the first power voltage has a negative voltage level lower than the ground voltage.

In some embodiments, the display panel includes a display area in which the plurality of pixels are arranged and a non-display area in which the first power line pattern, the second power line pattern, the first panel pad, and the second panel pad are arranged, and the non-display area is adjacent to the display area.

In some embodiments, the non-display area of the display panel further includes an edge area in which the first power line pattern is located, which is adjacent to the display area, a seal area in which a seal member is located, which is adjacent to the edge area, and a power line area in which the second power line pattern is located, which is adjacent to the seal area. The seal area surrounds the edge area and the display area, and the edge area and the power line area are spaced from each other with the seal area interposed therebetween.

In some embodiments, the first electrostatic discharge protection circuit includes a transient voltage suppressor diode including a first terminal connected to the first substrate pad and a second terminal connected to the second substrate pad.

In some embodiments, the second electrostatic discharge protection circuit includes a transient voltage suppressor diode including a first terminal connected to the substrate power pattern and a second terminal connected to the ground pattern.

In some embodiments, the circuit board is a flexible circuit board.

Some embodiments of the present disclosure provide an electronic device including a display panel including a plurality of pixels, a first panel pad, and a second panel pad, a circuit board including a first substrate pad and a second substrate pad, which are respectively connected to the first panel pad and the second panel pad to apply a first power voltage to the first panel pad and the second panel pad, and a bracket coupled to the display panel. The display panel further includes a first power line pattern connected to the second substrate pad to apply the first power voltage to the plurality of pixels and a second power line pattern connected to the first substrate pad. The circuit board further includes a first electrostatic discharge protection circuit connected between the first substrate pad and the second substrate pad, a first substrate power pattern electrically connected to the first substrate pad, a first substrate ground pattern receiving a ground voltage, and a second electrostatic discharge protection circuit connected between the first substrate power pattern and the first substrate ground pattern.

In some embodiments, the electronic device further includes a first conductive pattern facing the first substrate power pattern and a first conductive adhesive member connecting the first conductive pattern and the first substrate power pattern. One end of the circuit board is placed on an upper surface of the display panel, and the other end of the circuit board is placed on a rear surface of the display panel.

In some embodiments, the electronic device further includes a second conductive pattern facing the first substrate ground pattern and a second conductive adhesive member connecting the second conductive pattern and the first substrate ground pattern.

In some embodiments, the electronic device further includes a cushion member on the rear surface of the display panel, and the first conductive pattern and the second conductive pattern are placed on a rear surface of the cushion member.

In some embodiments, the bracket includes a bottom portion and a first sidewall bent from the bottom portion to the display panel. The bottom portion includes a bracket power pattern facing the first substrate power pattern, a bracket ground pattern facing the first substrate ground pattern, and an insulating pattern between the bracket power pattern and the bracket ground pattern.

In some embodiments, the circuit board further includes a second substrate power pattern connected to the first substrate power pattern by a via electrode in a first contact hole through the circuit board and a second substrate ground pattern connected to the first substrate ground pattern by a via electrode in a second contact hole through the circuit board.

In some embodiments, the electronic device further includes a third conductive adhesive member connecting the second substrate power pattern and the bracket power pattern and a fourth conductive adhesive member connecting the second substrate ground pattern and the bracket ground pattern.

In some embodiments, the bracket includes a second sidewall, a bracket power sidewall bent from the bracket power pattern to the display panel and a bracket insulating sidewall between the second sidewall and the bracket power sidewall.

In some embodiments, the first power voltage has a negative voltage level lower than the ground voltage.

In some embodiments, the display panel includes a display area in which the plurality of pixels are arranged and a non-display area in which the first power line pattern, the second power line pattern, the first panel pad, and the second panel pad are arranged, and the non-display area is adjacent to the display area.

In some embodiments, the non-display area of the display panel further includes an edge area in which the first power line pattern is placed, which is adjacent to the display area, a seal area in which a seal member is placed, which is adjacent to the edge area, and a power line area in which the second power line pattern is located, which is adjacent to the seal area. The seal area surrounds the edge area and the display area, and the edge area and the power line area are spaced from each other with the seal area interposed therebetween.

In some embodiments, the first electrostatic discharge protection circuit includes a transient voltage suppressor diode including a first terminal connected to the first substrate pad and a second terminal connected to the second substrate pad.

In some embodiments, the second electrostatic discharge protection circuit includes a transient voltage suppressor diode including a first terminal connected to the first substrate power pattern and a second terminal connected to the first substrate ground pattern.

According to the above, the display device includes a path through which the static electricity is discharged to the power voltage having the voltage level lower than the ground voltage. Therefore, although the static electricity is introduced through the signal lines or the pad to which the ground voltage is transmitted, the static electricity may be discharged. In addition, the power pattern of the power voltage is expanded, the dispersion effect of the electrostatic energy through the power pattern may increase. Thus, the electrostatic discharge protection function of the display device may be improved compared to related art devices.

BRIEF DESCRIPTION OF THE DRAWINGS

The above and other features of the present disclosure will become readily apparent by reference to the following detailed description when considered in conjunction with the accompanying drawings wherein.

DETAILED DESCRIPTION

In the present disclosure, it will be understood that when an element or layer is referred to as being "on", "connected to" or "coupled to" another element or layer, it can be directly on, connected or coupled to the other element or layer or intervening elements or layers may be present.

Like reference numerals refer to like elements throughout the disclosure. In the drawings, the thickness of layers, films, and regions may be exaggerated for clarity.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections may not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, may be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

Figure 1A:
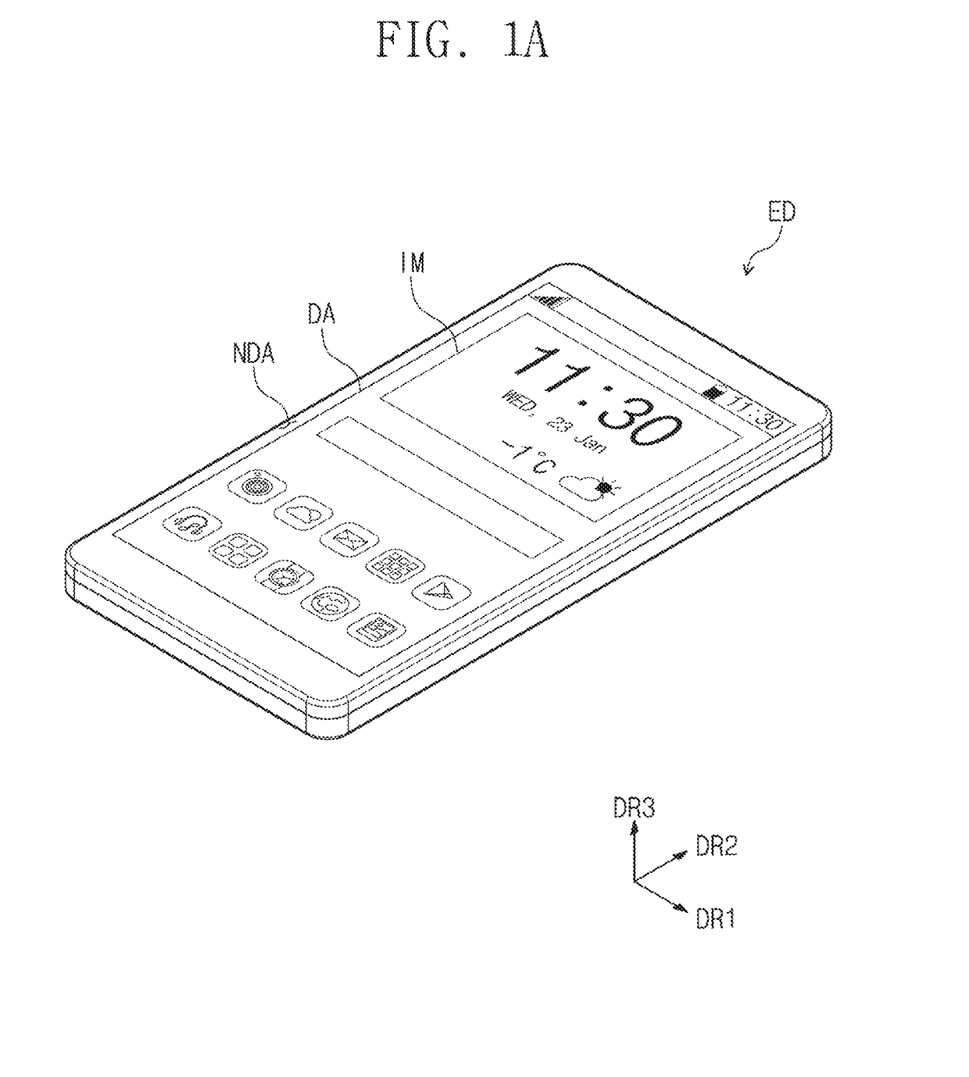
FIG. 1A is a perspective view showing an electronic device according to an example embodiment of the present disclosure.
Figure 1B:
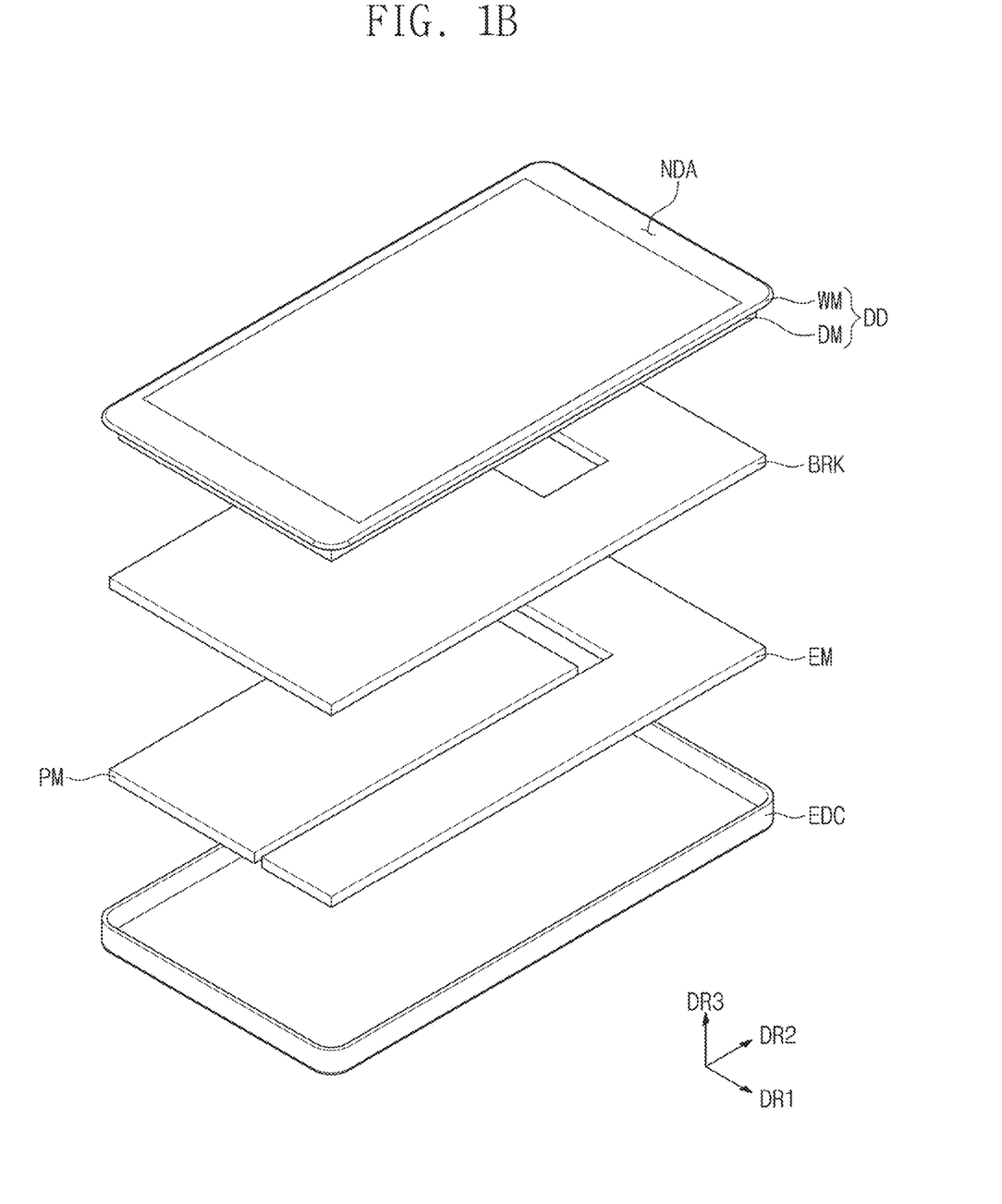
FIG. 1B is an exploded perspective view showing the electronic device of FIG. 1A according to an example embodiment of the present disclosure.
Figure 2:
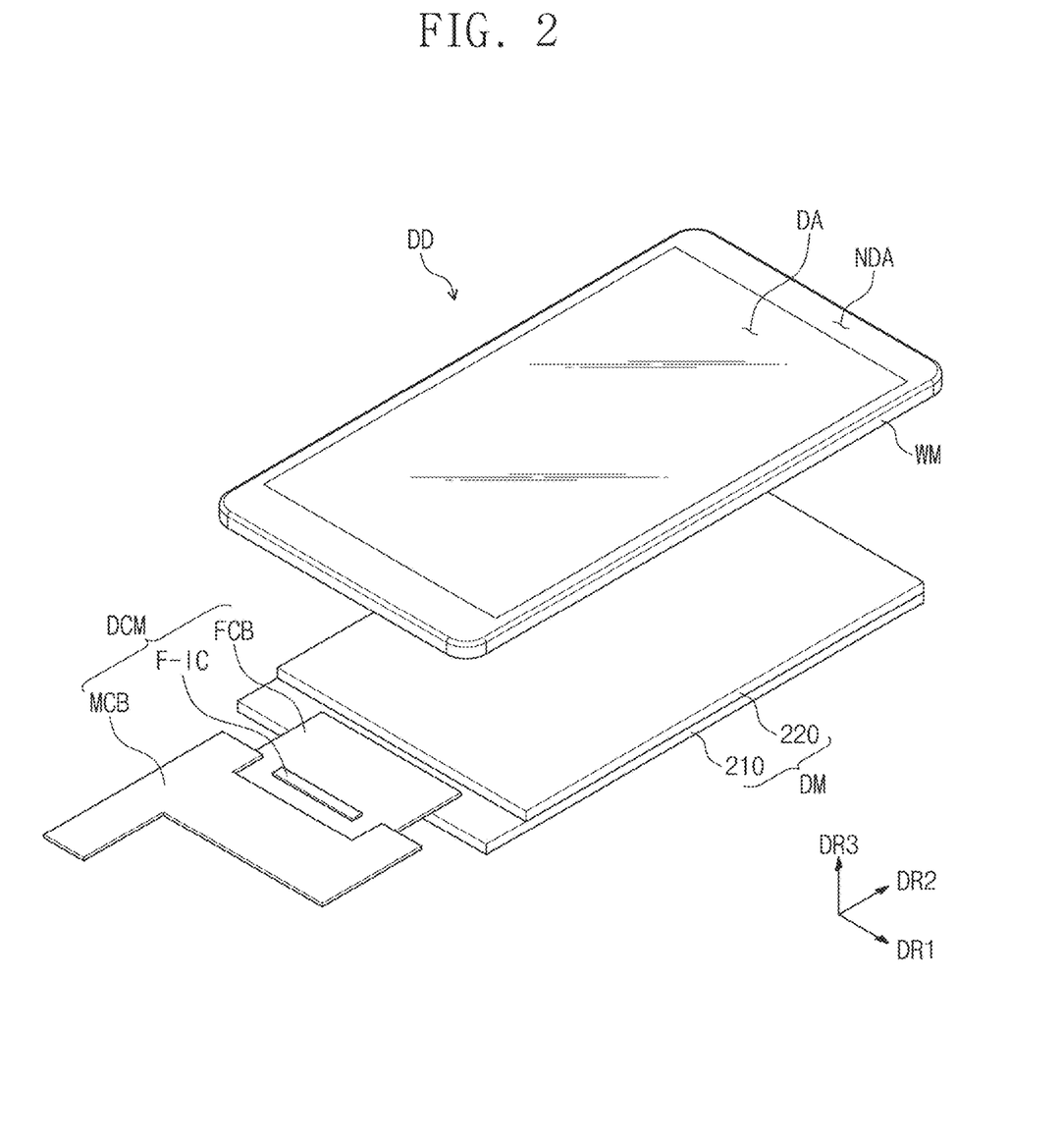
FIG. 2 is an exploded perspective view showing a display device according to an example embodiment of the present disclosure.
Figure 3:
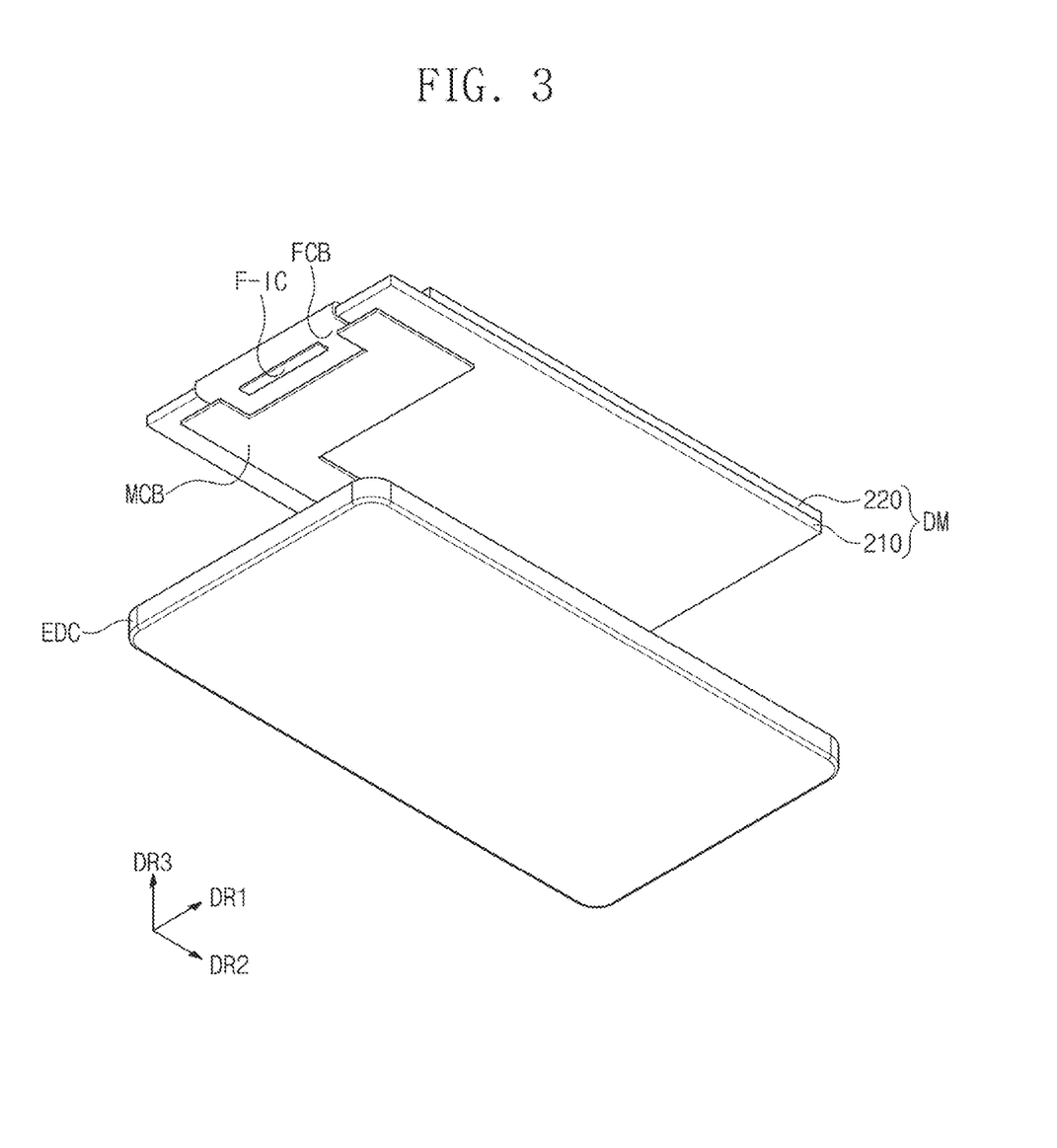
FIG. 3 is a perspective view showing a display panel shown in FIG. 2.

FIG. 1A is a perspective view showing an electronic device ED according to an example embodiment of the present disclosure. FIG. 1B is an exploded perspective view showing the electronic device ED according to an example embodiment of the present disclosure. FIG. 2 is an exploded perspective view showing a display device DD according to an example embodiment of the present disclosure. FIG. 3 is a perspective view showing a display panel 210 shown in FIG. 2.

FIGS. 1A-1B show a representative example of a portable terminal to which the display device is used. The portable terminal may include a tablet PC, a smartphone, a personal digital assistant (PDA), a portable multimedia player (PMP), a game unit, and a wrist watch type electronic device, however, it may not be limited thereto or thereby.

The display device DD according to the present disclosure may be applied to a large-sized electronic item, such as a television set or an outdoor billboard, and a small and medium-sized electronic item, such as a personal computer, a notebook computer, a car navigation unit, and a camera. These are merely examples and not limiting, the display device DD according to the present disclosure may be applied to other electronic devices as long as they do not depart from the concept of the present disclosure.

Referring to FIG. 1A, a display surface through which an image IM is displayed is a substantially parallel to a surface defined by a first direction DR1 and a second direction DR2. For example, the image IM displayed in the display surface of the display area DA is substantially parallel to a surface extended in the first direction DR1 and the second direction DR2. The electronic device ED includes a plurality of areas distinguished from each other on the display surface. The display surface includes a display area DA through which the image IM is displayed and a non-display area NDA adjacent to the display area DA. For example, the non-display area NDA may not display any image. The non-display area NDA may be called a bezel area. As an example, the display area DA may have a quadrangular shape. The non-display area NDA surrounds the display area DA. In addition, although not shown in figures, as an example, the electronic device ED may have a shape that is partially curved. As a result, a portion of the display area DA may have a curved shape.

A third direction DR3 indicates a normal line direction of the display surface, i.e., a thickness direction of the electronic device ED. Front (or upper, or first) and rear (or lower, or second) surfaces of each member of the electronic device ED are defined with respect to a direction in which the image IM is displayed. For example, the displayed image IM may act as a reference point for defining front (or upper, or first) and rear (or lower, or second) surfaces of each member of the electronic device ED. However, directions indicated by the first, second, and third directions DR1, DR2, and DR3 may be relative to each other and may be changed to other directions. Hereinafter, first, second, and third directions DR1, DR2, and DR3 respectively correspond to directions indicated by the first, second, and third direction axes DR1, DR2, and DR3 and are assigned with the same reference numerals as the first, second, and third directions DR1, DR2, and DR3.

Referring to FIG. 1B, the electronic device ED includes a display device DD, an electronic module EM, a power supply module PM, a bracket BRK, and an external case EDC. The components are schematically shown in FIG. 1B.

The display device DD includes a window member WM and a display module DM. The window member WM provides a front surface of the electronic device ED. The window member WM may include a glass substrate, a sapphire substrate, or a plastic substrate. In addition, the window member WM may include a functional layer, such as an anti-fingerprint layer, an anti-reflective layer, and a hard coating layer. In the present example embodiment, the window member WM has a flat shape in the display area DA, however, the shape of the window member WM may be suitably modified. For example, the shape of the window member WM may be defined based on the application of electronic device ED. Edges of the window member WM, which face each other in the first direction DR1, may be curved. In other embodiments, the edges of the window member WM may be customized to have different shapes based on the application of the electronic device ED.

The display module DM is located on a rear surface of the window member WM to generate an image. In addition, the display module DM may sense a user input, e.g., a user's touch and/or a user's pressure. For example, the display module DM may detect external input from an user, e.g., touch and/or pressure. The display module DM may be electrically connected to the electronic module EM via a flexible circuit board or an electronic component connector.

In the present example embodiment, the display module DM providing the flat display surface is shown as a representative example, however, the shape of the display module DM may be suitably modified. For example, the display module DM may be customized to have different shapes based on the application of the electronic device ED. Edges facing (or opposite) each other in the first direction DR1 of the display module DM may be bent to provide a curved surface. However, the edges of the display module may not be curved in other embodiments.

The power supply module PM supplies a power used for an overall operation of the electronic device ED. The power supply module PM may include a conventional battery module.

The bracket BRK is coupled to the display device DD and/or the external case EDC to divide an inner space of the electronic device ED. The bracket BRK provides a space in which other components are arranged. In addition, the bracket BRK may support the display device DD such that the display device DD is fixed without shaking. For example, the bracket BRK may provide stability to the structure of the display device DD. The bracket BRK may be provided with a coupling groove defined therein and corresponding to the shape of the electronic module EM to allow the electronic module EM to be fixed to the bracket BRK. The bracket BRK includes a metal member and/or a plastic member. In the present example embodiment, one bracket BRK is shown as a representative example, however, the electronic device ED may include a plurality of brackets BRK.

The external case EDC may be coupled to the bracket BRK and/or the display device DD. The external case EDC acts as an external surface of the electronic device ED. For example, the external case EDC may protect the electronic device ED from external interferences. In the present example embodiment, the external case EDC having a single body is shown as a representative example, however, the external case EDC may include plural bodies assembled with each other. For example, the external case EDC may include plural bodies functionally connected with each other. The external case EDC may include a plurality of frames and/or a plurality of plates made of a glass, plastic, or meta material.

The electronic module EM includes a mother board and a variety of functional modules mounted on the mother board to operate the electronic device ED. The mother board may be electrically connected to the display device DD via a conventional electronic component connector. In the present example embodiment, the mother board may include a rigid circuit board. However, in some embodiments, the mother board may include a flexible circuit board.

Referring to FIG. 2, the display module DM includes a display panel 210, an encapsulation member 220, and a driving control module DCM.

The display panel 210 may include various display elements. For example, the display elements may be liquid crystal capacitors, organic light emitting elements, electrophoretic elements, or electrowetting elements. In the present example embodiment, a plurality of organic light emitting diodes will be described as the display elements. That is, the display panel 210 according to the present example embodiment may be a flexible display panel, for example, an organic light emitting display panel. The display device DD will be described as an organic light emitting display device including the organic light emitting display panel. For example, the organic light emitting display panel may include organic light emitting diodes (OLEDs).

The encapsulation member 220 is located on the display panel 210. The encapsulation member 220 encapsulates the display panel 210 to protect the display elements from moisture and oxygen. For example, the encapsulation member 220 may fully cover the display panel 210 to protect the display panel 210 from external interferences. The encapsulation member 220 may include a transparent insulating material. The encapsulation member 220 may include at least one of an organic material and an inorganic material. The encapsulation member 220 may be provided in a variety of shapes. For example the shape of the encapsulation member 220 may be suitably modified based on the application of the electronic device ED.

In other embodiments, the display module DM may further include an input sensing unit on the encapsulation member 220 and may obtain coordinate information about an external input, e.g., a user's touch, or an anti-reflective unit such as a color filter. In addition, the display module DM may further include a protective film (not shown) on a rear surface of the display panel 210.

The driving control module DCM may include a first circuit board MCB, a second circuit board FCB, and a driving chip F-IC mounted on the second circuit board FCB. Some components of the driving control module DCM may be omitted according to various embodiments. The driving chip F-IC may be mounted on the display panel 210.

In some embodiments, a plurality of passive elements and a plurality of active elements may be mounted on the first circuit board MCB. In other embodiments, the first circuit board MCB may be electrically connected to the mother board of the electronic module EM (refer to FIG. 1B) via the electronic component connector.

The second circuit board FCB is electrically connected to the display panel 210. One end of the second circuit board FCB is bonded on pads arranged in an area of the display panel 210 and electrically connected to the display panel 210.

According to an embodiment, the driving chip F-IC may be mounted on the second circuit board FCB in a chip-on-film (COF) manner. The driving chip F-IC may apply electrical signals to the pixels via signal lines. The second circuit board FCB may be implemented by a flexible printed circuit board.

Referring to FIG. 3, because the second circuit board FCB has a flexible property, the second circuit board FCB may have a shape curved along a side surface of the display panel 210. That is, one end of the second circuit board FCB may be on an upper surface of the display panel 210, and the other end of the second circuit board FCB may be on the rear surface of the display panel 210. As described above, because the second circuit board FCB is curved along the side surface of the display panel 210, the first circuit board MCB connected to the other end of the second circuit board FCB may be on the rear surface of the display panel 210. That is, the display module DM may be located inside the external case EDC based on the structure in which the first circuit board MCB is placed on the rear surface of the display panel 210. For example, the location of the display module DM inside the external case EDC may vary depending on the location of the first circuit board MCB on the rear surface of the display panel 210.

Figure 4:
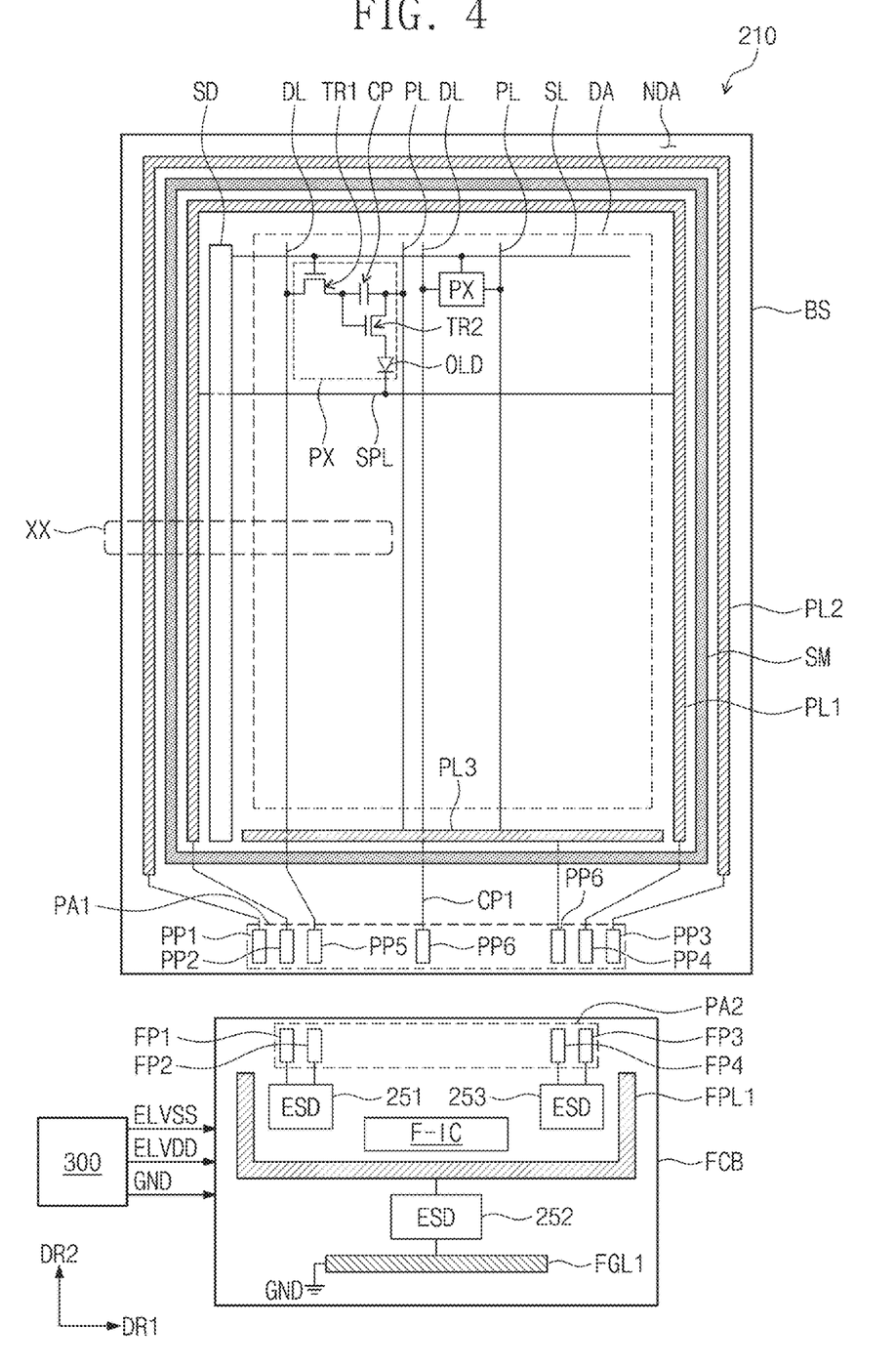
FIG. 4 is a plan view showing a display panel according to an example embodiment of the present disclosure.
Figure 5:
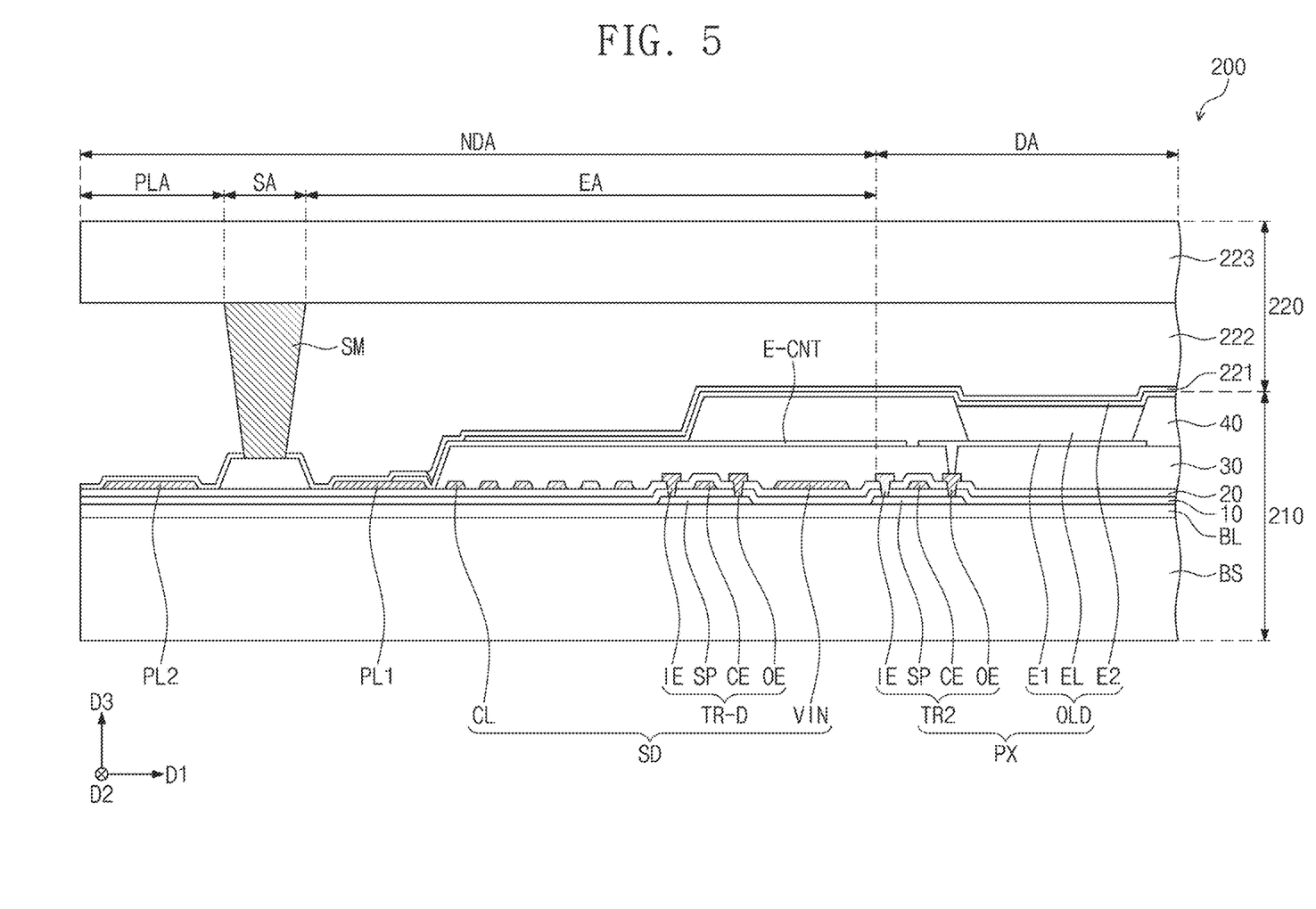
FIG. 5 is a cross-sectional view showing an area XX shown in FIG. 4.

FIG. 4 is a plan view showing the display panel 210 according to an example embodiment of the present disclosure. FIG. 5 is a cross-sectional view showing an area XX shown in FIG. 4.

Referring to FIGS. 4 and 5, the display panel 210 may include the display area DA and the non-display area NDA. The image is displayed through the display panel 210. For example, the image may be displayed in the display area DA of the display panel 210. The non-display area NDA is adjacent to the display area DA. The non-display area NDA may surround an edge of the display area DA. However, this is merely an example, and according to some other embodiments, the non-display area NDA may be adjacent to only a portion of the edge of the display area DA or may be omitted. That is, the non-display area NDA may not be limited to any specific embodiment.

The display panel 210 may generate the image and may display the image through the display area DA. The display panel 210 may include a base substrate BS and at least one pixel PX. For example, the display panel 210 may include a plurality of pixels PX. The display area DA and the non-display area NDA may be areas provided by the base substrate BS. The base substrate BS may include an insulating substrate. For example, the base substrate BS may include a glass substrate, a plastic substrate, or a combination thereof.

The pixels PX are arranged in the display area DA. For example, the pixels PX are arranged in the display area DA in a shape of a matrix. The pixels PX are arranged along the first and second directions DR1 and DR2 and arranged in a matrix form to be spaced from each other. Each of the pixels PX receives the electrical signal and emits lights to display an image.

Each of the pixels PX is connected to a plurality of signal lines. The signal lines include scan lines SL, data lines DL, power lines PL and sub-power lines SPL.

The scan lines SL extend in the first direction DR1 and are arranged along the second direction DR2 to be spaced from each other. The scan lines SL transmit scan signals to the pixels PX.

The data lines DL are insulated from the scan lines SL while crossing the scan lines SL. For example, the data lines DL are electrically insulated from the scan lines SL at the crossing regions of the data lines DL and the scan lines SL. In the present example embodiment, the data lines DL extend in the second direction DR2 and are arranged along the first direction DR1 to be spaced from each other. The data lines DL transmit data signals to the pixels PX.

The power lines PL may be insulated from the scan lines SL and the data lines DL. In the present example embodiment, the power lines PL extend in the first direction DR1 and are arranged along the second direction DR2 to be spaced from each other. The power lines PL transmit a second power signal to the pixels PX.

The sub-power lines SPL may be insulated from the scan lines SL and the data lines DL. In the present example embodiment, the sub-power lines SPL extend in the first direction DR1 and are arranged along the second direction DR2 to be spaced from each other. The sub-power lines SPL transmit a first power signal to the pixels PX.

Each of the pixels PX may include a first transistor TR1, a second transistor TR2, a capacitor CP, and a light emitting element OLD. For example, the light emitting element OLD may be an organic light emitting diode (OLED). The first transistor TR1 is turned on in response to the scan signal applied thereto via a corresponding scan line SL from among the scan lines SL and applies the data signal applied thereto via a corresponding data line DL from among the data lines DL to the capacitor CP.

The capacitor CP is charged with a voltage corresponding to an electric potential difference between a second power voltage ELVDD provided from a third power line pattern PL3 and the data signal. The second transistor TR2 is turned on by the voltage charged in the capacitor CP to provide the second power voltage ELVDD applied thereto through the power line PL to the light emitting element OLD.

The light emitting element OLD may generate light and may control a light amount of the light in response to the electrical signal. For example, the light emitting element OLD may include an organic light emitting element, a quantum dot light emitting element, an electrophoretic element, or an electrowetting element.

The light emitting element OLD is connected to a sub-power line SPL to receive a first power voltage ELVSS different from the second power voltage ELVDD. A driving current corresponding to a difference between the electrical signal provided from the second transistor TR2 and the first power voltage ELVSS flows through the light emitting element OLD, and the light emitting element OLD may generate light corresponding to the driving current.

However, this is merely an example. The pixel PX according to embodiments of the present disclosure may include electronic components with various configurations and arrangements, and it may not be particularly limited.

The signal lines SL, DL, PL and SPL are on a base substrate BS. The scan line SL, the data line DL, power line PL and the sub-power line SPL may transmit different electrical signals from each other.

The scan line SL extends in the first direction DR1. The scan line SL is provided in a plural number, and the scan lines SL are arranged along the second direction DR2 to be spaced from each other. For the convenience of explanation, one scan line SL is shown as a representative example.

According to some embodiments, the display panel 210 includes a scan driving circuit SD on the base substrate BS to apply the electrical signal to the scan line SL.

The scan driving circuit SD may include at least one driving transistor TR-D and a plurality of conductive lines CL and VIN. The driving transistor TR-D has substantially the same structure as the second transistor TR2, however, it may not be limited thereto or thereby. That is, the driving transistor TR-D may have different structures from the second transistor TR2. The conductive lines CL and VIN are connected to the driving transistor TR-D to form an electronic circuit. The scan driving circuit SD may be connected to the scan lines SL.

A first power line pattern PL1, a second power line pattern PL2, and a third power line pattern PL3 are located in the non-display area NDA. The first power line pattern PL1 may include first and second long sides extending in the second direction DR2 and short sides extending in the first direction DR1. The second power line pattern PL2 may include first and second long sides extending in the second direction DR2 and short sides extending in the first direction DR1. The first power line pattern PL1 and the second power line pattern PL2 may be spaced from each other when viewed in a plan view, where the plan view is a view viewed from a direction normal to the plane defined by the first and second directions DR1 and DR2. The third power line pattern PL3 may be spaced from the first power line pattern PL1 and the second power line pattern PL2. The shape and arrangement of the first power line pattern PL1, the second power line pattern PL2, and the third power line pattern PL3 may be changed in various suitable ways without being limited to the example embodiment of FIG. 4. For example, the shape and location of the first power line pattern PL1, the second power line pattern PL2, and the third power line pattern PL3 may be different based on design choices.

A seal member SM is located in the non-display area NDA to surround the first power line pattern PL1 and the third power line pattern PL3. In the example embodiment, the seal member SM is located between the first power line pattern PL1 and the second power line pattern PL2.

The seal member SM is located between the base substrate BS and a cover substrate 223 to support a cell-gap between the base substrate BS and the cover substrate 223 and combines the base substrate BS and the cover substrate 223.

A plurality of panel pads PP1 to PP6 is located in the non-display area NDA. Areas in which the panel pads PP1 to PP6 are located from among the non-display area NDA may be referred to as a "panel pad area PA1". The panel pads PP1 to PP6 may include power pads PP1 to PP4 and PP6 and a data pad PP5. In some embodiments, there may be different number of power pads or data pads.

The second circuit board FCB may be coupled to the panel pad area PA1 to drive the pixel PX. The second circuit board FCB is electrically connected to the display panel 210 via first to fourth substrate pads FP1 to FP4 located in a substrate pad area PA2.

Among the power pads PP1 to PP4 and PP6, the power pads PP2 and PP4 are connected to the first power line pattern PL1. The first power line pattern PL1 may receive the first power voltage ELVSS provided from the outside through the power pads PP2 and PP4. The power pads PP1 and PP3 are connected to the second power line pattern PL2. The second power line pattern PL2 may receive the first power voltage ELVSS provided from the outside through the power pads PP1 and PP3.

The power pad PP6 is connected to the third power line pattern PL3. The third power line pattern PL3 may receive the second power voltage ELVDD from the outside through the power pad PP6.

The data pads PP5 are connected to a conductive pattern CP1. The conductive pattern CP1 connects the data lines DL and the data pads PP5. The conductive pattern CP1 includes a plurality of line patterns that extends in the second direction DR2 and is arranged in the first direction DR1 to be spaced from each other.

In the present example embodiment, the conductive pattern CP1 may be placed on a layer different from the data lines DL. For example, the conductive pattern CP1 may be located at the same layer as the scan lines SL. That is, the conductive pattern CP1 may be integrally formed (or placed) with the data lines DL and functions as portions of the data lines DL or may be respectively connected to each of the data lines DL via a separate bridge pattern. The conductive pattern CP1 according to the example embodiment of the present disclosure may have various suitable shapes as long as the conductive pattern CP1 is connected to the data lines DL, and are not particularly limited.

Referring to FIGS. 4 and 5, the base substrate BS may be an insulating substrate. For example, the base substrate BS may include a plastic substrate or a grass substrate. An auxiliary layer BL is placed on the base substrate BS to cover an entire surface of the base substrate BS. The auxiliary layer BL includes an inorganic material. The auxiliary layer BL includes a barrier layer and/or a buffer layer. Accordingly, the auxiliary layer BL prevents oxygen or moisture from infiltrating into the pixels PX through the base substrate BS and reduces a surface energy of the base substrate BS such that the pixels PX are stably formed on the base substrate BS. For example, the auxiliary layer BL may protect the pixels PX from external interferences and may also provide structural stability to the pixels PX.

The pixels PX may be arranged in the display area DA. In the present example embodiment, the second transistor TR2 and the light emitting element OLD among components of an equivalent circuit of the pixels PX shown in FIG. 2 are shown as a representative example. Each of first, second, third, and fourth insulating layers 10, 20, 30, and 40 may include an organic material and/or an inorganic material and may have a single-layer or multi-layer structure.

The second transistor TR2 is located on the base substrate BS and includes a control electrode CE, an input electrode IE, an output electrode OE, and a semiconductor pattern SP. The control electrode CE is spaced from the semiconductor pattern SP with the first insulating layer 10 interposed therebetween and is connected to one electrode of the capacitor CP. Each of the input electrode IE and the output electrode OE is on the second insulating layer 20 and is connected to the semiconductor pattern SP after penetrating through the first insulating layer 10 and the second insulating layer 20. The input electrode IE is connected to the other electrode of the capacitor CP, and the output electrode OE is connected to the light emitting element OLD.

The light emitting element OLD is connected to the second transistor TR2 and the sub-power line SPL. The light emitting element OLD includes a first electrode E1, a light emitting layer EL, and a second electrode E2. The first electrode E1 is placed on the third insulating layer 30 and connected to the second transistor TR2 after penetrating through the third insulating layer 30. The light emitting layer EL covers the first electrode E1 exposed through the fourth insulating layer 40. The light emitting layer EL may include a light emitting material that generates the light in response to the electric potential difference. For example, the light emitting layer EL may include an organic light emitting material or an quantum dot.

The second electrode E2 is located on the light emitting layer EL. The second electrode E2 is on the entire surface of the display area DA. For example, the second electrode E2 may cover the entire surface of the display area DA. The second electrode E2 extends from the display area DA to the non-display area NDA and is connected to a connection pattern E-CNT. The connection pattern E-CNT may correspond to the sub-power line SPL.

The sub-power line SPL applies the first power voltage ELVSS to the light emitting element OLD. The first power voltage ELVSS may have an electric potential different from that of the second power voltage ELVDD. The light emitting element OLD generates a light corresponding to an electric potential difference between the data signal from the second transistor TR2 and the first power voltage ELVSS from the sub-power line SPL and emits the light. For example, the light emitting element OLD emits light having a luminance corresponding to an electric potential difference between the data signal from the second transistor TR2 and the first power voltage ELVSS from the sub-power line SPL.

The scan driving circuit SD may include at least one driving transistor TR-D and the conductive lines CL and VIN. The driving transistor TR-D has substantially the same structure as the second transistor TR2, however, it may not be limited thereto or thereby. That is, the driving transistor TR-D may have a structure different from the second transistor TR2. The conductive lines CL and VIN are connected to the driving transistor TR-D to form the electronic circuit. The scan driving circuit SD may be connected to the scan lines SL.

The scan lines SL extend from the display area DA and are connected to the scan driving circuit SD located in the non-display area NDA. The scan driving circuit SD applies electrical signals, for example, the scan signals, to the pixels PX via the scan lines SL.

In the present example embodiment, one scan driving circuit SD is shown, however, the scan driving circuit SD may be provided in a plural number. In this case, the scan driving circuits SD may be spaced from each other with the display area DA interposed therebetween along the first direction DR1. In addition, in the present example embodiment, the scan driving circuit SD may be directly on the base substrate BS, however, it may not be limited thereto or thereby. That is, the scan driving circuit SD may be provided after being mounted on a separate circuit board. In this case, the scan driving circuit SD may be connected to the display panel 210 via a conductive adhesive member. The scan driving circuit SD according to the example embodiment of the present disclosure may be provided in various suitable ways, however it may not be particularly limited.

A first power line pattern PL1 is placed in the non-display area NDA to apply the first power voltage ELVSS of the same electric potential to each of the pixels PX.

The first power line pattern PL1 and the second power line pattern PL2 are placed in the non-display area NDA to be spaced from each other along the first direction DR1.

The encapsulation member 220 is located on the fourth insulating layer 40 to encapsulate the light emitting element OLD. The encapsulation member 220 may include an organic layer 221, an encapsulation layer 222, a cover substrate 223, and the seal member SM.

The non-display area NDA includes an edge area EA, a seal area SA, and a power line area PLA. The edge area EA is located adjacent to the display area DA, and the scan driving circuit SD and the first power line pattern PL1 are placed in the edge area EA. The seal area SA is located adjacent to the edge area EA, and the seal member SM is located in the seal area SA. The power line area PLA is placed adjacent to the seal area SA, and the second power line pattern PL2 is located in the power line area PLA. The seal area SA may have a shape surrounding the edge area EA and the display area DA. The edge area EA and the power line area PLA may be spaced from each other with the seal area SA interposed therebetween.

The encapsulation layer 222 may include an inactive material. The cover substrate 223 is placed on the base substrate BS. The cover substrate 223 covers the display area DA and the non-display area NDA. The cover substrate 223 may be spaced from the pixels PX with the encapsulation layer 222 interposed therebetween.

The seal member SM is located between the base substrate BS and the cover substrate 223 to support the cell-gap between the base substrate BS and the cover substrate 223 and combines the base substrate BS and the cover substrate 223. The seal member SM prevents external environment from affecting the edge area EA and the display area DA to protect the pixels PX. For example, the seal member SM may protect the edge area EA and the display area DA from external interferences in order to provide protection to the pixels PX.

In addition, the seal member SM reduces or minimizes the exposure of the first power line pattern PL1 to the outside to prevent the external environment, such as static electricity, from affecting the first power line pattern PL1. For example, the seal member SM provides protection to the first power line pattern PL1 from being damaged by external interferences like static electricity.

Referring to FIG. 4 again, the second circuit board FCB is electrically connected to the display panel 210 through the first to fourth substrate pads FP1 to FP4 located in a substrate pad area PA2. The first to fourth substrate pads FP1 to FP4 may be respectively connected to the panel pads PP1 to PP4. Although not shown in figures, the substrate pad area PA2 may further include substrate pads connected to the panel pads PP5 and PP6.

The second circuit board FCB receives the first power voltage ELVSS, the second power voltage ELVDD, and a ground voltage GND from a voltage generator 300. In the example embodiment, the voltage generator 300 may be included in the electronic module EM shown in FIG. 1B. According to another embodiment, the voltage generator 300 may be included in the second circuit board FCB.

The second circuit board FCB transmits the first power voltage ELVSS and the second power voltage ELVDD from the voltage generator 300 to the display panel 210. In the example embodiment, the second circuit board FCB may transmit the first power voltage ELVSS to the panel pads PP1 to PP4 of the display panel 210 through the first to fourth substrate pads FP1 to FP4. In addition, the second circuit board FCB may transmit the second power voltage ELVDD to the panel pad PP6 of the display panel 210 through the substrate pad (not shown).

The second circuit board FCB further includes a first substrate power pattern FPL1, a first substrate ground pattern FGL1, and first, second, and third electrostatic discharge protection circuits (ESDs) 251, 252, and 253.

The first substrate power pattern FPL1 electrically connects the first substrate pad FP1 and the third substrate pad FP3. The first substrate ground pattern FGL1 receives a ground voltage GND.

The first electrostatic discharge protection circuit 251 is connected to the first substrate pad FP1 and the second substrate pad FP2. The second electrostatic discharge protection circuit 252 is connected to the first substrate power pattern FPL1 and the first substrate ground pattern FGL1. The third electrostatic discharge protection circuit 253 is connected to the third substrate pad FP3 and the fourth substrate pad FP4.

Figure 6:
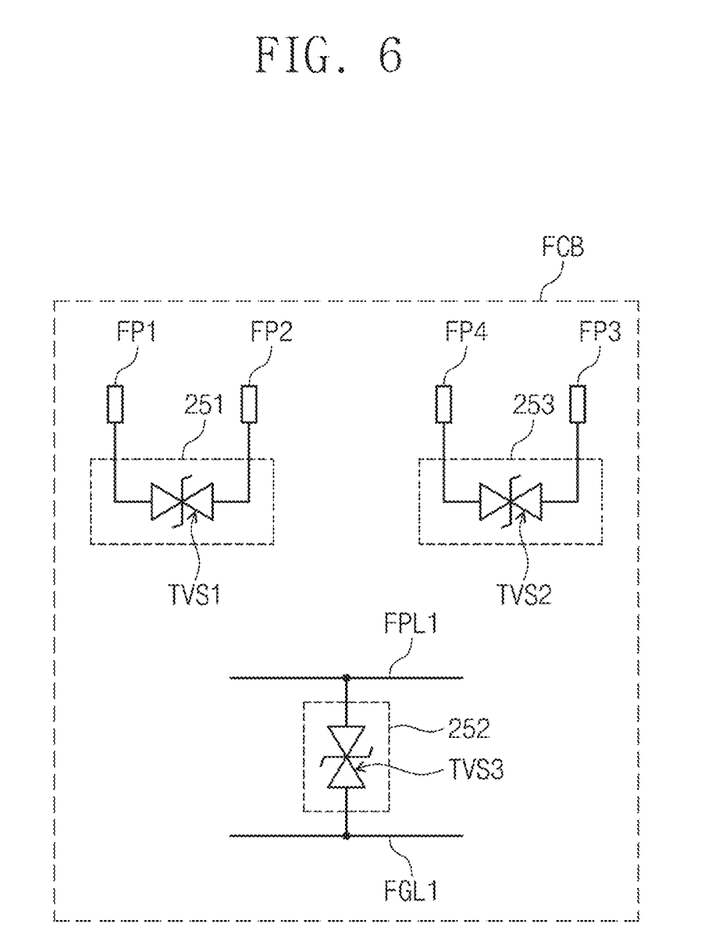
FIG. 6 is a circuit diagram showing static electricity protection elements of a circuit board.

FIG. 6 is a circuit diagram showing static electricity protection elements of a second circuit board FCB.

Referring to FIG. 6, the first electrostatic discharge protection circuit 251 may include a transient voltage suppressor (TVS) diode TVS1. The TVS diode TVS1 is connected between the first substrate pad FP1 and the second substrate pad FP2 according to the embodiment illustrated in FIG. 6.

The second electrostatic discharge protection circuit 252 may include a TVS diode TVS2. The TVS diode TVS2 is connected between the first substrate power pattern FPL1 and the first substrate ground pattern FGL1.

The third electrostatic discharge protection circuit 253 may include a TVS diode TVS3. The TVS diode TVS3 is connected between the third substrate pad FP3 and the fourth substrate pad FP4.

Referring to FIGS. 4 and 6, when static electricity is introduced through the first substrate ground pattern FGL1 to which the ground voltage GND is transmitted, the second electrostatic discharge protection circuit 252 may induce the static electricity to be discharged to the first power voltage ELVSS having a voltage level lower than the ground voltage GND.

The static electricity may be introduced through the second power line pattern PL2 and/or the first substrate power pattern FPL1 in a state that the first to fourth substrate pads FP1 to FP4 of the second circuit board FCB are connected to the panel pads PP2 and PP4 of the display panel 210. In this case, the first electrostatic discharge protection circuit 251 and the third electrostatic discharge protection circuit 253 clip an instantaneously rising overvoltage, and thus the static electricity may be prevented from being introduced into the first substrate power pattern FPL1 through the second substrate pad FP2 and the fourth substrate pad FP4. Accordingly, the first substrate power pattern FPL1 directly connected to the pixels PX may be protected from the static electricity.

In the example embodiment, the first, second, and third electrostatic discharge protection circuit 251, 252, and 253 include the TVS diodes TVS1, TVS3, and TVS2, respectively, however, the first, second, and third electrostatic discharge protection circuit 251, 252, and 253 may include a high-frequency cutoff element such as a ferrite bead instead of the TVS diode.

The bracket BRK of the electronic device ED (refer to FIGS. 1A and 1B) may be implemented by a metal material having conductivity. For example, the bracket BRK of the electronic device ED may be made of a highly conductive metal, for example, silver, gold, copper, or the like. As the bracket BRK is connected to the ground voltage GND, the static electricity may be dispersed through the bracket BRK when the static electricity is introduced.

According to the example embodiment, although the static electricity is introduced through the first substrate ground pattern FGL1, the static electricity may be discharged to the first power voltage ELVSS having the voltage level lower than the ground voltage GND. In addition, a method of extending the power pattern of the first power voltage ELVSS is further desired to disperse an electrostatic energy through the first power voltage ELVSS.

Figure 7:
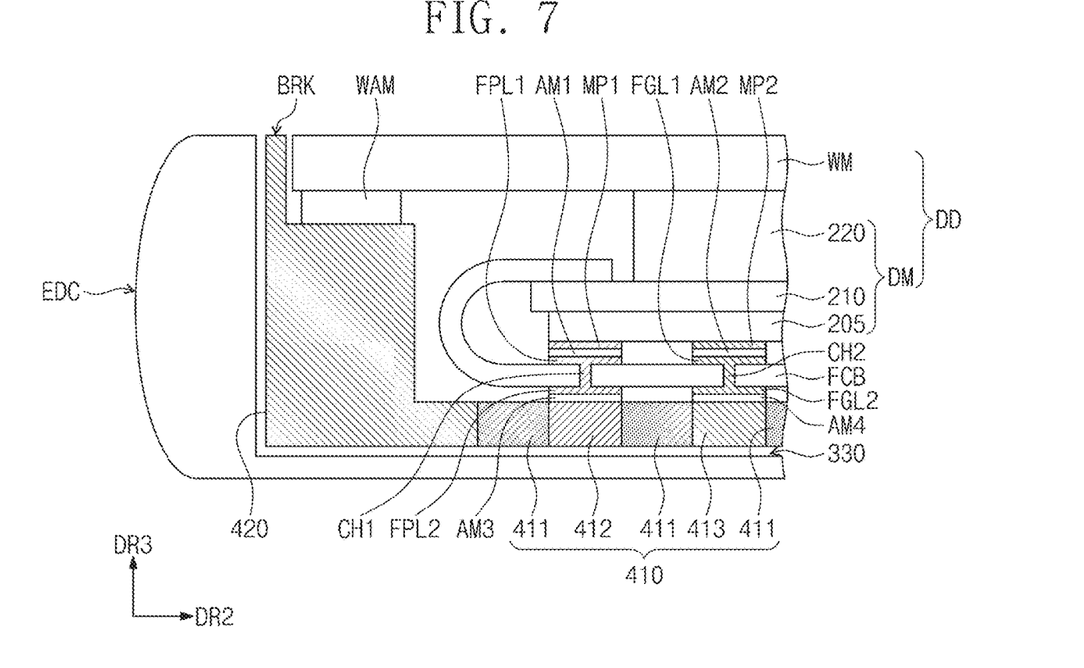
FIG. 7 is a first side view showing an electronic device according to an example embodiment of the present disclosure.
Figure 8:
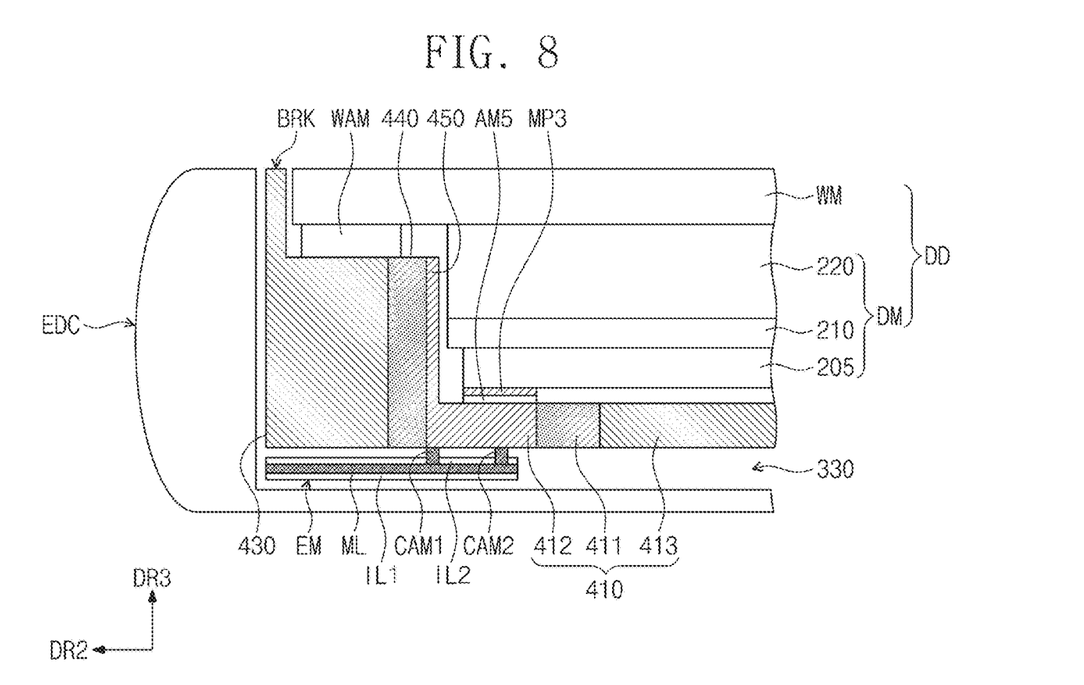
FIG. 8 is a second side view showing an electronic device according to an example embodiment of the present disclosure.

FIG. 7 is a first side view showing an electronic device according to an example embodiment of the present disclosure. FIG. 8 is a second side view showing an electronic device according to an example embodiment of the present disclosure.

FIG. 7 shows the first side in which the second circuit board FCB is curved along the side surface of the display panel 210, and FIG. 8 shows a second side facing the first side in the second direction DR2.

Referring to FIG. 7, the display device DD includes the window member WM and the display module DM. The display device DD and the bracket BRK may be coupled to each other by a window adhesive member WAM.

The display module DM may further include a cushion tape 205 placed between the display panel 210 and the second circuit board FCB. The cushion tape 205 prevents the second circuit board FCB from directly making contact with the display panel 210, which may reduce the chance of the second circuit board FCB being damaged. For example, the cushion tape 205 provides separation between the second circuit board FCB and the display panel 210, and in turn provides protection to the second circuit board FCB.

The second circuit board FCB may further include a second substrate power pattern FPL2, a second substrate ground pattern FGL2, a first contact hole CH1, and a second contact hole CH2. The second substrate ground pattern FGL2 may be electrically connected to the first substrate ground pattern FGL1 by a via electrode located in the first contact hole CH1. In addition, the second substrate power pattern FPL2 may be electrically connected to the first substrate power pattern FPL1 by a via electrode located in the second contact hole CH2.

In the present example embodiment, the first substrate power pattern FPL1 and the first substrate ground pattern FGL1 are located on the upper surface of the second circuit board FCB, and the second substrate power pattern FPL2 and the second substrate ground pattern FGL2 are located on the lower surface of the second circuit board FCB. However, the present disclosure may not be limited thereto or thereby. For example, the second circuit board FCB may include a plurality of insulating layers, and the first substrate power pattern FPL1, the second substrate power pattern FPL2, the first substrate ground pattern FGL1, and the second substrate ground pattern FGL2 may be located between the insulating layers. In this case, contact holes may be desired to expose the first substrate power pattern FPL1, the second substrate power pattern FPL2, the first substrate ground pattern FGL1, and the second substrate ground pattern FGL2 to the outside. For example, the contact holes CH1, CH2 expose the first substrate power pattern FPL1, the second substrate power pattern FPL2, the first substrate ground pattern FGL1, and the second substrate ground pattern FGL2 to the outside.

A first conductive pattern MP1 is placed on a lower surface of the cushion tape 205 to face the first substrate ground pattern FGL1. A second conductive pattern MP2 is located on the lower surface of the cushion tape 205 to face the first substrate power pattern FPL1. The first conductive pattern MP1 and the second conductive pattern MP2 may be spaced from each other in the second direction DR2.

The first conductive pattern MP1 and the first substrate ground pattern FGL1 may be connected to each other by a first conductive adhesive member AM1. Accordingly, the first power voltage ELVSS may be applied to the first conductive pattern MP1. The second conductive pattern MP2 and the first substrate power pattern FPL1 may be connected to each other by a second conductive adhesive member AM2. Accordingly, the ground voltage GND may be applied to the second conductive pattern MP2. The first conductive adhesive member AM1 and the second conductive adhesive member AM2 may include an anisotropic conductive film (ACF) having a large adhesive force. In the example embodiment of the present disclosure, the first conductive adhesive member AM1 and the second conductive adhesive member AM2 may include a solder paste, a solder ball, or a solder bump.

The external case EDC may be coupled to the display device DD and/or the bracket BRK.

The bracket BRK includes a bottom portion 410 and a first sidewall 420 bent from the bottom portion 410 to the display panel 210.

The bottom portion 410 includes a bracket insulating pattern 411, a bracket power pattern 412, and a bracket ground pattern 413. The bottom portion 410 adjacent to the first sidewall 420 may be the bracket ground pattern 413.

The bracket insulating pattern 411 is placed between the bracket power pattern 412 and the bracket ground pattern 413 to insulate the bracket power pattern 412 from the bracket ground pattern 413.

The bracket power pattern 412 may face the second substrate ground pattern FGL2. The bracket power pattern 412 and the second substrate ground pattern FGL2 may be connected to each other by a third conductive adhesive member AM3. The bracket ground pattern 413 may face the second substrate power pattern FPL2. The bracket ground pattern 413 and the second substrate power pattern FPL2 may be connected to each other by the forth conductive adhesive member AM4. The third conductive adhesive member AM3 and the fourth conductive adhesive member AM4 may include an anisotropic conductive film (ACF) having a large adhesive force. In the example embodiment of the present disclosure, the third conductive adhesive member AM3 and the fourth conductive adhesive member AM4 may include a solder paste, a solder ball, or a solder bump.

As described above, even though the static electricity is introduced through the first substrate ground pattern FGL1, the second substrate ground pattern FGL2, the second conductive pattern MP2, and/or the first sidewall 420, which receive the ground voltage GND, the static electricity may be discharged to the first power voltage ELVSS having the voltage level lower than the ground voltage GND. In addition, the power pattern of the first power voltage ELVSS is expanded to the first substrate power pattern FPL1, the second substrate power pattern FPL2, and the first conductive pattern MP1, the dispersion effect of the electrostatic energy through the power pattern may increase. For example, in order to increase the dispersion of the electrostatic energy through the power pattern, the power pattern of the first power voltage ELVSS may be expanded to the first substrate power pattern FPL1, the second substrate power pattern FPL2, and the first conductive pattern MP1.

Referring to FIG. 8, other components may be arranged in a space 330 between the external case EDC and the bracket BRK. For example, the power supply module PM (refer to FIG. 1B), such as a battery, and the electronic module EM may be arranged in the space 330.

The electronic module EM may be arranged in the space 330 between the bracket BRK and the external case EDC.

Although not shown in figures, the electronic module EM may include the voltage generator 300 shown in FIG. 4.

The electronic module EM may have a structure in which a first insulating layer IL1, a conductive layer ML, and a second insulating layer IL2 are sequentially stacked one on another. The conductive layer ML may be the power pattern to transmit the first power voltage ELVSS.

The electronic module EM and the bracket BRK may be electrically connected to each other by first and second conductive members CAM1 and CAM2 located between the electronic module EM and the bracket BRK in the third direction DR3 that is the thickness direction of the display device DD. The first and second conductive members CAM1 and CAM2 not only electrically connect the electronic module EM and the bracket BRK but also physically connect the electronic module EM and bracket BRK. For example, the first and second conductive members CAM1 and CAM2 provide both the physical and electrical connections between the electronic module EM and the bracket BRK. In the example embodiment, the first and second conductive members CAM1 and CAM2 may include conductive screws.

The conductive layer ML of the electronic module EM may be electrically connected to the bracket power pattern 412 of the bracket BRK by the first and second conductive members CAM1 and CAM2.

The bracket BRK includes a second sidewall 430, a bracket insulating sidewall 440, and a bracket power sidewall 450. The second sidewall 430 is adjacent to the external case EDC. The bracket power sidewall 450 is bent from the bracket power pattern 412 of the bottom portion 410 to the display panel 210. The bracket insulating sidewall 440 is located between the second sidewall 430 and the bracket power sidewall 450 to insulate the second sidewall 430 from the bracket power sidewall 450. For example, the bracket insulating sidewall 440 provides electrical insulation between the second sidewall 430 and the bracket power sidewall 450. The ground voltage GND may be applied to the second sidewall 430.

A third conductive pattern MP3 is located on the lower surface of the cushion tape 205 and faces the bracket power pattern 412. The third conductive pattern MP3 and the bracket power pattern 412 may be connected to each other by a fifth conductive adhesive member AM5. Accordingly, the first power voltage ELVSS may be applied to the third conductive pattern MP3. The fifth conductive adhesive member AM5 may include an anisotropic conductive film (ACF) having a large adhesive force. In the example embodiment of the present disclosure, the fifth conductive adhesive member AM5 may include a solder paste, a solder ball, or a solder bump.

Although the static electricity is introduced through the second sidewall 430 and the bracket ground pattern 413, which receive the ground voltage GND, the static electricity may be discharged to the first power voltage ELVSS having the voltage level lower than the ground voltage GND. In addition, the power pattern of the first power voltage ELVSS is expanded to the bracket power sidewall 450, the bracket power pattern 412, and the third conductive pattern MP3, the dispersion effect of the electrostatic energy through the first power voltage ELVSS may increase.

Although the example embodiments of the present disclosure have been described, it is understood that the present disclosure may not be limited to these example embodiments but various changes and modifications can be made by one ordinary skilled in the art within the spirit and scope of the present disclosure as hereinafter claimed. Therefore, the disclosed subject matter may not be limited to any single embodiment described herein, and the scope of the present inventive concept shall be determined according to the attached claims.

What is claimed is:

1. An electronic device comprising:
    a display panel comprising a plurality of pixels, a first panel pad, and a second panel pad;
    a circuit board comprising a first substrate pad and a second substrate pad, the first substrate pad and the second substrate pad being respectively connected to the first panel pad and the second panel pad to apply a first power voltage to the first panel pad and the second panel pad; and
    a bracket coupled to the display panel, the bracket comprising at least one portion protruding in a thickness direction of the display panel,
    wherein the display panel further comprises a first power line pattern connected to the second substrate pad to apply the first power voltage to the pixels and a second power line pattern connected to the first substrate pad, and
    wherein the circuit board further comprises:
        a first electrostatic discharge protection circuit connected between the first substrate pad and the second substrate pad;
        a first substrate power pattern electrically connected to the first substrate pad;
        a first substrate ground pattern configured to receive a ground voltage; and
        a second electrostatic discharge protection circuit connected between the first substrate power pattern and the first substrate ground pattern.

2. The electronic device of claim 1, further comprising:
    a first conductive pattern facing the first substrate power pattern; and
    a first conductive adhesive member connecting the first conductive pattern and the first substrate power pattern,
    wherein a first end of the circuit board is placed on an upper surface of the display panel, and a second end of the circuit board is placed on a rear surface of the display panel.

3. The electronic device of claim 2, further comprising:
    a second conductive pattern facing the first substrate ground pattern; and
    a second conductive adhesive member connecting the second conductive pattern and the first substrate ground pattern.

4. The electronic device of claim 3, further comprising a cushion member on the rear surface of the display panel, wherein the first conductive pattern and the second conductive pattern are placed on a rear surface of the cushion member.

5. The electronic device of claim 1, wherein the bracket further comprises a bottom portion and the at least one portion comprises a first sidewall bent from the bottom portion toward the display panel, and the bottom portion comprises:
    a bracket power pattern facing the first substrate power pattern;
    a bracket ground pattern facing the first substrate ground pattern; and
    an insulating pattern between the bracket power pattern and the bracket ground pattern.

6. The electronic device of claim 5, wherein the circuit board further comprises:

a second substrate power pattern connected to the first substrate power pattern by a via electrode in a first contact hole through the circuit board; and a second substrate ground pattern connected to the first substrate ground pattern by a via electrode in a second contact hole through the circuit board.

7. The electronic device of claim 6, further comprising:

a third conductive adhesive member connecting the second substrate power pattern and the bracket power pattern; and a fourth conductive adhesive member connecting the second substrate ground pattern and the bracket ground pattern.

8. The electronic device of claim 5, wherein the bracket further comprises:

a second sidewall;

a bracket power sidewall bent from the bracket power pattern toward the display panel; and a bracket insulating sidewall between the second sidewall and the bracket power sidewall.

9. The electronic device of claim 1, wherein the first power voltage has a negative voltage level lower than the ground voltage.

10. The electronic device of claim 1, wherein:

the display panel comprises a display area in which the pixels are arranged and a non-display area in which the first power line pattern, the second power line pattern, the first panel pad, and the second panel pad are arranged, and the non-display area is adjacent to the display area.

11. The electronic device of claim 10, wherein the non-display area of the display panel further comprises:

an edge area in which the first power line pattern is placed, the edge area being adjacent to the display area;

a seal area in which a seal member is placed, the seal area being adjacent to the edge area; and a power line area in which the second power line pattern is located, the power line area being adjacent to the seal area, the seal area surrounding the edge area and the display area, and the edge area and the power line area are spaced from each other with the seal area interposed therebetween.

12. The electronic device of claim 1, wherein the first electrostatic discharge protection circuit comprises a transient voltage suppressor diode comprising a first terminal connected to the first substrate pad and a second terminal connected to the second substrate pad.

13. The electronic device of claim 1, wherein the second electrostatic discharge protection circuit comprises a transient voltage suppressor diode comprising a first terminal connected to the first substrate power pattern and a second terminal connected to the first substrate ground pattern.

* * * * *